US008310038B2

(12) United States Patent
Kim et al.

(10) Patent No.: US 8,310,038 B2
(45) Date of Patent: Nov. 13, 2012

(54) INTEGRATED CIRCUIT PACKAGING SYSTEM WITH EMBEDDED CONDUCTIVE STRUCTURE AND METHOD OF MANUFACTURE THEREOF

(75) Inventors: JinGwan Kim, Seoul (KR); KyuWon Lee, Ansung-Si (KR); JiHoon Oh, Suwon (KR); JongVin Park, Seoul (KR)

(73) Assignee: Stats Chippac Ltd., Singapore (SG)

( * ) Notice: Subject to any disclaimer, the term of this patent is extended or adjusted under 35 U.S.C. 154(b) by 28 days.

(21) Appl. No.: 13/070,219

(22) Filed: Mar. 23, 2011

(65) Prior Publication Data

US 2012/0241967 A1 Sep. 27, 2012

(51) Int. Cl.
*H01L 21/10* (2006.01)
(52) U.S. Cl. ........ 257/686; 257/666; 257/787; 438/109; 438/124
(58) Field of Classification Search .................. 257/666, 257/676, 686, 777, 723, 724; 438/106, 107, 438/109, 111, 112, 123, 124
See application file for complete search history.

(56) References Cited

U.S. PATENT DOCUMENTS

| 6,933,602 | B1 | 8/2005 | Patel et al. |
| 7,304,381 | B2 | 12/2007 | Rumer et al. |
| 7,683,469 | B2 | 3/2010 | Oh et al. |
| 7,919,360 | B1* | 4/2011 | Camacho et al. ............. 438/123 |
| 8,258,612 | B2* | 9/2012 | Kuan et al. .................... 257/676 |
| 2005/0087847 | A1* | 4/2005 | Kuan et al. .................... 257/666 |
| 2007/0013042 | A1 | 1/2007 | Henell et al. |
| 2010/0123225 | A1* | 5/2010 | Gruenhagen et al. ......... 257/666 |
| 2010/0176497 | A1* | 7/2010 | Merilo et al. ................. 257/668 |
| 2010/0230796 | A1 | 9/2010 | Yim et al. |

* cited by examiner

*Primary Examiner* — S. V. Clark
(74) *Attorney, Agent, or Firm* — Ishimaru & Associates LLP; Mikio Ishimaru; Stanley M. Chang (57) ABSTRACT

A method of manufacture of an integrated circuit packaging system includes: providing a package carrier; mounting an integrated circuit device to the package carrier; mounting an embeddable conductive structure, having a non-horizontal portion between a lower portion and an elevated portion and a hole, to the integrated circuit device with the lower portion over the integrated circuit device; mounting an interposer to the lower portion and below the elevated portion; and forming an encapsulation having a recess exposing the interposer and the elevated portion.

20 Claims, 8 Drawing Sheets

INTEGRATED CIRCUIT PACKAGING SYSTEM WITH EMBEDDED CONDUCTIVE STRUCTURE AND METHOD OF MANUFACTURE THEREOF

TECHNICAL FIELD

The present invention relates generally to an integrated circuit packaging system, and more particularly to a system for conductive structure.

BACKGROUND ART

The electronic industry continues to seek products that are lighter, faster, smaller, multi-functional, more reliable, and more cost-effective. The advent of multi-function electronic devices, such as cell phones that are also game platforms, cameras, Internet portals, and music or video players, has brought immense pressure on the electronics device manufacturers and the manufacturing companies that support them.

In an effort to meet such requirements, package assembly techniques have been developed for smaller packages. These types of packages can combine two or more semiconductor chips in a single package, thereby realizing increased memory density, multi-functionality, and/or reduced package footprint.

As integration increases while package sizes decreases, adverse interactions within the package and external to the package can affect the functionality of circuits in the package. Heat or radiation can affect the internal circuits.

Thus, a need still remains for an integrated circuit packaging system for increasing integration, decrease size, and increased reliability. In view of the challenges of balancing all these needs, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a package carrier; mounting an integrated circuit device to the package carrier; mounting an embeddable conductive structure, having a non-horizontal portion between a lower portion and an elevated portion and a hole, to the integrated circuit device with the lower portion over the integrated circuit device; mounting an interposer to the lower portion and below the elevated portion; and forming an encapsulation having a recess exposing the interposer and the elevated portion.

The present invention provides an integrated circuit packaging system including: a package carrier; an integrated circuit device mounted to the package carrier; an embeddable conductive structure, having a non-horizontal portion between a lower portion and an elevated portion and a hole, mounted to the integrated circuit device with the lower portion over the integrated circuit device; an interposer mounted to the lower portion and below the elevated portion; and an encapsulation having a recess exposing the interposer and the elevated portion.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the active side of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements with no intervening element.

The term "processing" as used herein includes deposition of material or photoresist, patterning, exposure, development, etching, cleaning, and/or removal of the material or photoresist as required in forming a described structure.

Figure 1:
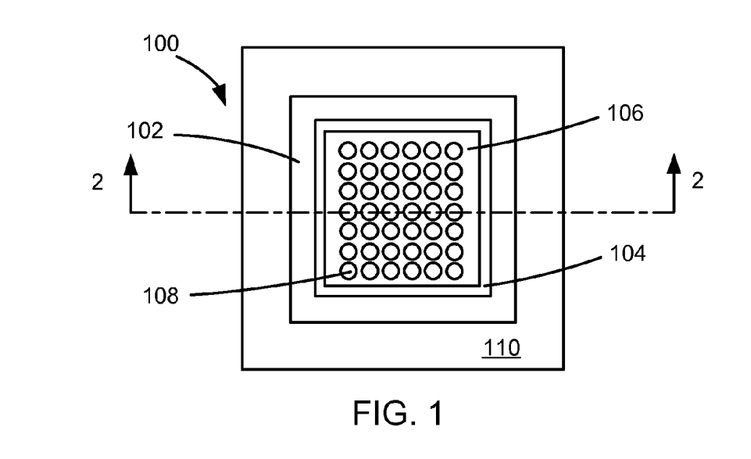
FIG. 1 is a top view of an integrated circuit packaging system in a first embodiment of the present invention.

Referring now to FIG. 1, therein is shown a top view of an integrated circuit packaging system 100 in a first embodiment of the present invention. The top view depicts an encapsulation 102 having a recess 104. The encapsulation 102 is a cover for protecting circuits within the encapsulation 102.

The encapsulation 102 can be formed for a number of processes and materials. For example, the encapsulation 102 can be formed by an injection molding process, a transfer molding process, or a compression molding process. Also for example, the encapsulation 102 can be made from epoxy molding compound or other types of resins.

The recess 104 can expose an interposer 106 of the integrated circuit packaging system 100. The interposer 106 is a mounting structure allowing other devices to mount to and electrically connect to the integrated circuit packaging system 100. Examples of the interposer 106 are a laminate substrate, a ceramic substrate, and a rigid planar structure with redistribution layer for electrical conduction. The interposer 106 can include contact terminals 108 as shown in the recess 104. The contact terminals 108 provide election connections with the integrated circuit packaging system 100.

Along a periphery and a horizontal perimeter of the encapsulation 102, a portion of an embeddable conductive structure 110 can be exposed from the encapsulation 102. The embeddable conductive structure 110 is provides a thermal and electrical conduction path embedded with the integrated circuit packaging system 100. The embeddable conductive structure 110 functions as a heat spreader as well as an electromagnetic interference (EMI) shield when grounded.

Figure 2:
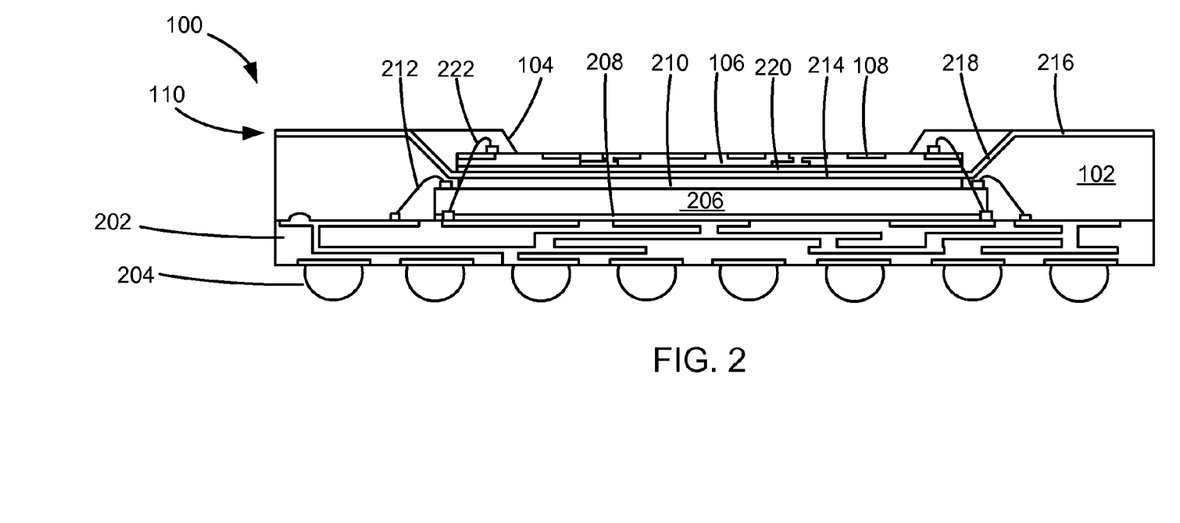
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The cross-sectional view depicts a package carrier 202. The package carrier 202 is a structure for mounting devices or components and for providing electrical conduction path between these devices and components and to the external environment. Examples of the package carrier 202 are a laminated substrate, a ceramic substrate, and a rigid planar structure with electrical conduction pathways.

External package conductors 204 can be attached to a bottom of the package carrier 202. The External package conductors 204 allows the integrated circuit packaging system 100 to connect electrically, mechanically, or a combination thereof to the external environment. The term external is defined as exposed directly outside to the integrated circuit packaging system 100. Examples of the External package conductors 204 are solder balls, solder bumps, conductive balls, conductive pillars, or conductive posts.

An integrated circuit device 206 can mount to the package carrier 202 with a device adhesive 208. The integrated circuit device 206 is an active device having active circuitry therein. Examples of the integrated circuit device 206 can be a wire bond integrated circuit die, a packaged integrated circuit, or a flip chip.

The device adhesive 208 functions to keep the integrated circuit device 206 in place during the manufacturing process of the integrated circuit packaging system 100. Examples of the device adhesive 208 are die-attach adhesive and a film adhesive.

A spacer 210 can be attached to the integrated circuit device 206. The spacer 210 provides a clearance between the surfaces to which it is mounted based on the thickness of the spacer 210. Examples of the spacer 210 are an adhesive film, a dummy die, or a nonconductive rigid structure.

The spacer 210 can also provide the clearance for first internal interconnects 212 connecting the package carrier 202 and the integrated circuit device 206. The first internal interconnects 212 are conductive structures providing electrical conduction paths between the package carrier 202 and the integrated circuit device 206. Examples of the first internal interconnects 212 are bond wires, ribbon bond wires, reversed-stand-off-stitch bonding wires, or elevated planar interconnects. The first internal interconnects 212 can attach to the integrated circuit device 206 and not contact the spacer 210.

The embeddable conductive structure 110 can be mounted on the spacer 210 and over the integrated circuit device 206, the first internal interconnects 212, and the package carrier 202. The cross-sectional view depicts the embeddable conductive structure 110 having a lower portion 214 and an elevated portion 216 with a non-horizontal portion 218 between the lower portion 214 and the elevated portion 216.

The lower portion 214 can be planar and sized to cover the entire horizontal area of the integrated circuit device 206. As another example, the lower portion 214 can cover most of the horizontal area of the integrated circuit device 206 leaving a peripheral portion exposed for the first internal interconnects 212 to loop from the integrated circuit device 206 without contacting the lower portion 214 or the non-horizontal portion 218.

The non-horizontal portion 218 can extend from the lower portion 214 to the elevated portion at an obtuse angle relative to the lower portion 214. The lower portion 214 and the non-horizontal portion 218 can function as mold interlock for the embeddable conductive structure 110 thereby improving performance in moisture sensitivity level (MSL) test.

The elevated portion 216 can be planer to a top side of the encapsulation 102 and is exposed from the encapsulation 102 at the top side. The elevated portion 216 can extend to the perimeter of the integrated circuit packaging system 100 and the encapsulation 102. Ends of the elevated portion 216 can be exposed from a vertical side of the encapsulation 102.

A conductive adhesive 220 can be applied to the lower portion 214. The conductive adhesive 220 provides mechanical attachment and is thermally conductive. The interposer 106 can attach to the lower portion 214 with the conductive adhesive 220. The interposer 106 can be mounted to the lower portion 214 below a plane having the elevated portion 216.

Second internal interconnects 222 can attach the interposer 106 and the package carrier 202. The Second internal interconnects 222 are conductive structures directly connecting the interposer 106 and the package carrier 202. Examples of the Second internal interconnects 222 are bond wires, ribbon bond wires, reversed-stand-off-stitch bonding wires, or elevated planar interconnects.

The encapsulation 102 can formed over and on the package carrier 202 covering the conductive adhesive 220, the spacer 210, the integrated circuit device 206, the first internal interconnects 212, and the Second internal interconnects 222. The encapsulation 102 can also cover the lower portion 214 and the non-horizontal portion 218. The top side of the encapsulation 102 can expose the elevated portion 216. The vertical side of the encapsulation 102 can also expose the elevated portion 216.

The encapsulation 102 can also include the recess 104 over the lower portion 214, the spacer 210, and the integrated circuit device 206. The recess 104 can expose a portion of the interposer 106 and the contact terminals 108 of the interposer 106.

It has been discovered that the present invention provides the integrated circuit packaging system 100 with improved thermal management. The lower portion 214 of the embeddable conductive structure 110 covers most if not the entire surface of the integrated circuit device 206 provide maximum surface area to dissipate heat away from the integrated circuit device 206 to the elevated portion 216, which is exposed to ambient or the open environment to dissipate heat. The embeddable conductive structure 110 has a higher thermal conduction than the encapsulation 102 thereby improving the thermal management of the integrated circuit packaging system 100.

Figure 3:
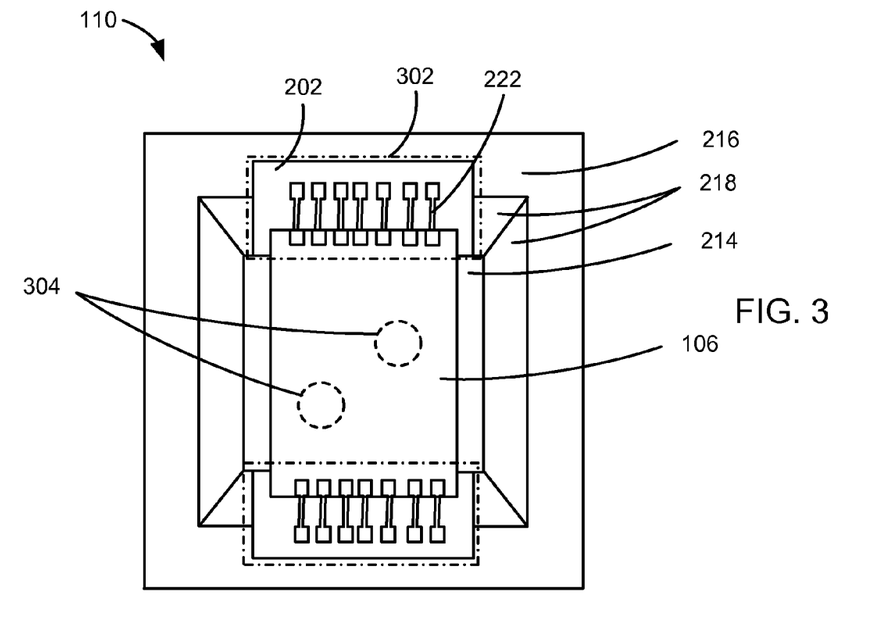
FIG. 3 is a top view of the embeddable conductive structure with the package carrier and the interposer.

Referring now to FIG. 3, therein is shown a top view of the embeddable conductive structure 110 with the package carrier 202 and the interposer 106. The embeddable conductive structure 110 can include the elevated portion 216 along the perimeter and peripheral region. The non-horizontal portion 218 can transition the embeddable conductive structure 110 from the elevated portion 216 to the lower portion 214.

The embeddable conductive structure 110 can include holes 302 that span from the lower portion 214, the non-horizontal portion 218, and to part of the elevated portion 216. The Second internal interconnects 222 can connect between the interposer 106 attached to the lower portion 214 and the package carrier 202 through the holes 302.

A bottom side of the interposer 106 can include connection pads 304, which are depicted by dotted circles in this top view. The connection pads 304 provide electrical and thermal connection with the interposer 106. The connection pads 304 can connect to the lower portion 214 with the conductive adhesive 220 of FIG. 2 and can provide grounding to the embeddable conductive structure 110. For illustrative clarity, the contact terminals 108 of FIG. 1 are omitted from this depiction to allow clear depiction of the connection pads 304 depicted by the dotted circles.

It has been discovered that the present invention provides the integrated circuit packaging system 100 with improved electromagnetic interference shielding. The lower portion 214 of the embeddable conductive structure 110 when grounded through the connection pads 304. The lower portion 214 mostly or entirely covers the surface area of the integrated circuit device 206 of FIG. 2 and the interposer 106 providing maximum shielding.

Figure 4:
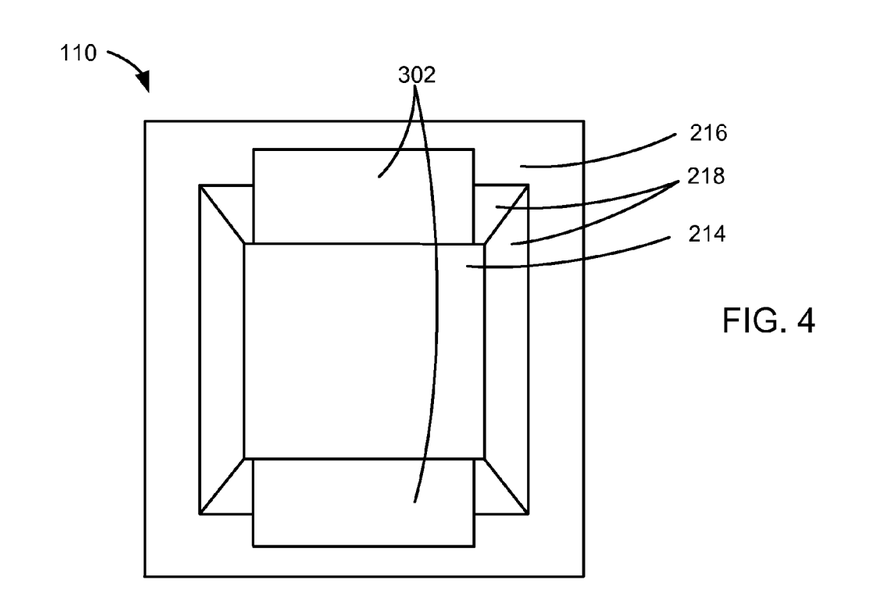
FIG. 4 is a top view of the embeddable conductive structure.

Referring now to FIG. 4, therein is shown a top view of the embeddable conductive structure 110. The embeddable conductive structure 110 is shown without the interposer 106 of FIG. 3 and the package carrier 202 of FIG. 3. The top view shows the embeddable conductive structure 110 having the lower portion 214 recessed from the elevated portion 216 and the non-horizontal portion 218 between the other two portions.

The holes 302 can be at opposite sides of the embeddable conductive structure 110. The holes 302 span from the lower portion 214 through a part of the non-horizontal portion to part of the elevated portion 216.

It has been discovered that the present invention provides the integrated circuit packaging system 100 of FIG. 1 with maximum thermal management, EMI shielding, while providing maximum connectivity with decreased profile. The thermal management and EMI shielding have been discussed above. The holes 302 in the embeddable conductive structure 110 allows for electrical connection from the interposer 106 above the lower portion 214 and to the package carrier 202 through the holes 302. The holes 302 also allow electrical connections between the interposer 106 and the integrated circuit device 206 of FIG. 2. Because the interposer 106 is mounted on the lower portion 214, which is below the elevated portion 216 and the encapsulation 102 of FIG. 1, the integrated circuit packaging system 100 has a lower profile.

Figure 5:
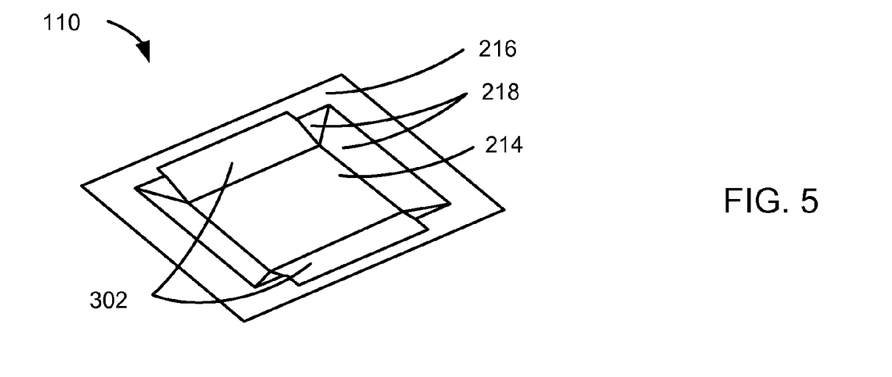
FIG. 5 is an isometric view of the embeddable conductive structure.

Referring now to FIG. 5, therein is shown an isometric view of the embeddable conductive structure 110. FIG. 5 depicts the lower portion 214 can be directly connected to the non-horizontal portion 218. The non-horizontal portion 218 can be directly connected to the elevated portion 216. The holes 302 are shown at opposite ends of the embeddable conductive structure 110. Each of the holes 302 spans the lower portion 214 across the non-horizontal portion 218 to the elevated portion 216.

Figure 6:
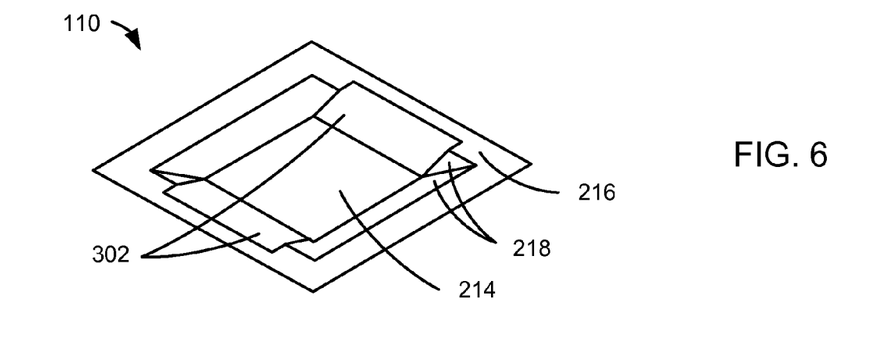
FIG. 6 is a further isometric view of the embeddable conductive structure.

Referring now to FIG. 6, therein is shown a further isometric view of the embeddable conductive structure 110. FIG. 6 can be depiction of FIG. 5 rotated 90 degrees clockwise from FIG. 5. The embeddable conductive structure 110 is shown with the non-horizontal portion 218 between the lower portion 214 and the elevated portion 216. The holes 302 are shown span between the lower portion 214 and the elevated portion 216 and across the non-horizontal portion 218.

Figure 7:
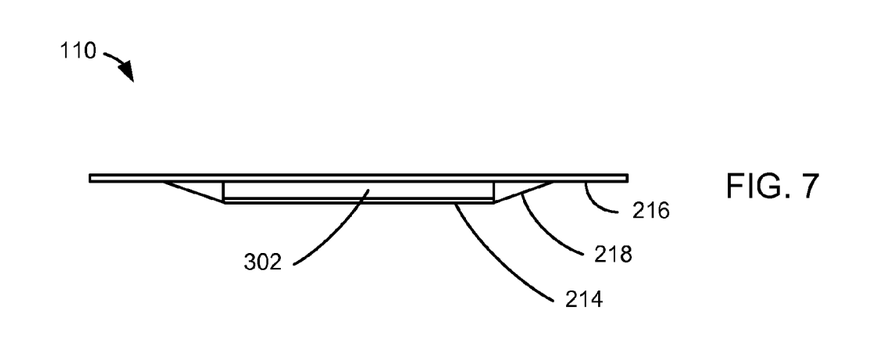
FIG. 7 is a side view of the embeddable conductive structure.

Referring now to FIG. 7, therein is shown a side view of the embeddable conductive structure 110. The side view depicts the elevated portion 216 above the lower portion 214 with the non-horizontal portion 218 between the two. The holes 302 can be see through the non-horizontal portion 218.

Figure 8:
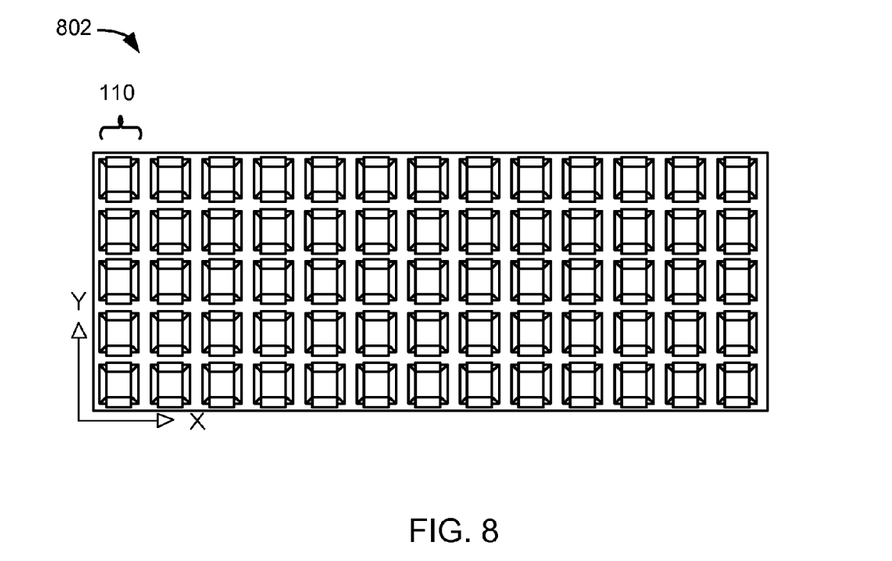
FIG. 8 is a top view of a strip of the embeddable conductive structure.

Referring now to FIG. 8, therein is shown a top view of a strip 802 of the embeddable conductive structure 110. The strip 802 includes the embeddable conductive structure 110 in an array configuration. Each of the embeddable conductive structure 110 can be located for the particular locations of a target package to receive the strip 802.

For example, the integrated circuit packaging system 100 of FIG. 1 during manufacturing can be formed in multiples is a package strip (not shown) with spacing for each of the integrated circuit packaging system 100 to align with each of the embeddable conductive structure 110 in the strip 802. As such, the strip 802 can be mounted over the package strip before mounting the interposer 106 of FIG. 2.

Figure 9:
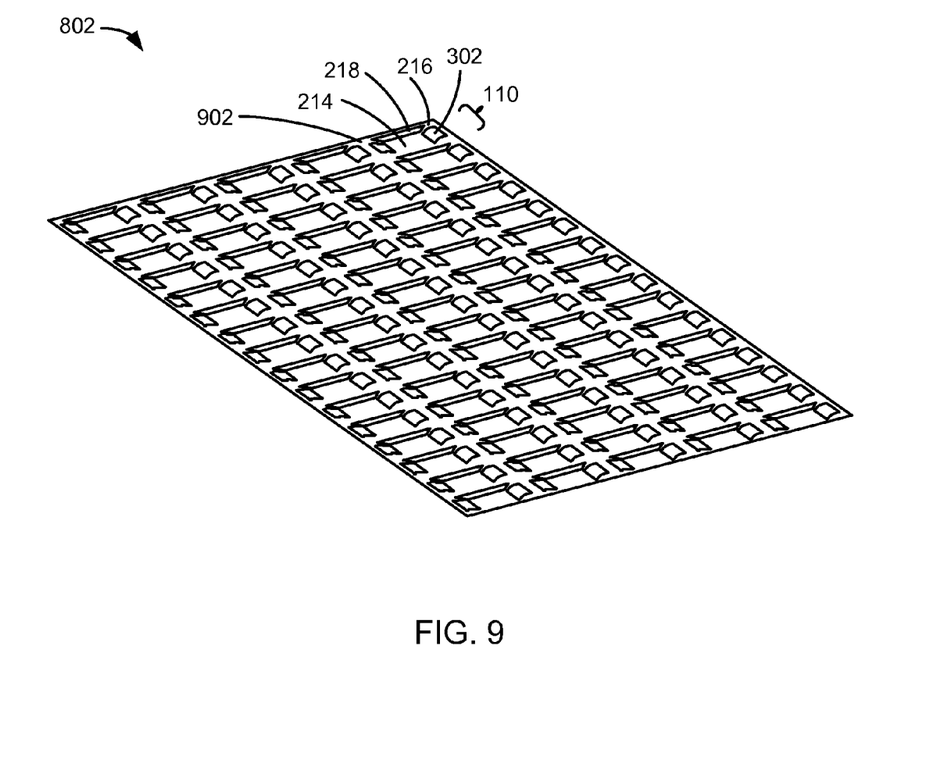
FIG. 9 is an isometric view of the strip of the embeddable conductive structure.

Referring now to FIG. 9, therein is shown an isometric view of the strip 802 of the embeddable conductive structure 110. The strip 802 includes the holes 302 and the lower portion 214 connected to the non-horizontal portion 218. The strip 802 can include elevated regions 902 that once separated can form the elevated portion 216 of FIG. 2.

Figure 10:
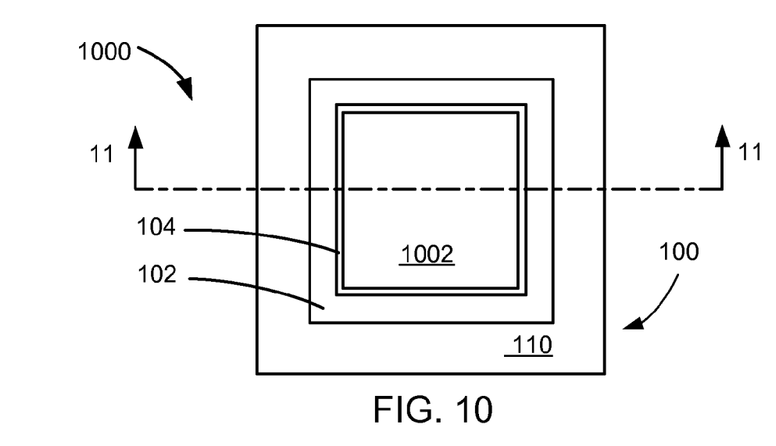
FIG. 10 is a top view of an integrated circuit packaging system in a second embodiment of the present invention.

Referring now to FIG. 10, therein is shown a top view of an integrated circuit packaging system 1000 in a second embodiment of the present invention. The top view depicts the integrated circuit packaging system 1000 in a package-on-package (PoP) configuration with a stacking device 1002 over the integrated circuit packaging system 100.

The stacking device 1002 is a device having passive circuits, active circuits, or a combination thereof. Examples of the stacking device 1002 can be a flip chip, a packaged integrated circuit, or a passive component.

The stacking device 1002 can mount on the integrated circuit packaging system 100 in the recess 104. The top view also depicts the encapsulation 102 and the embeddable conductive structure 110.

Figure 11:
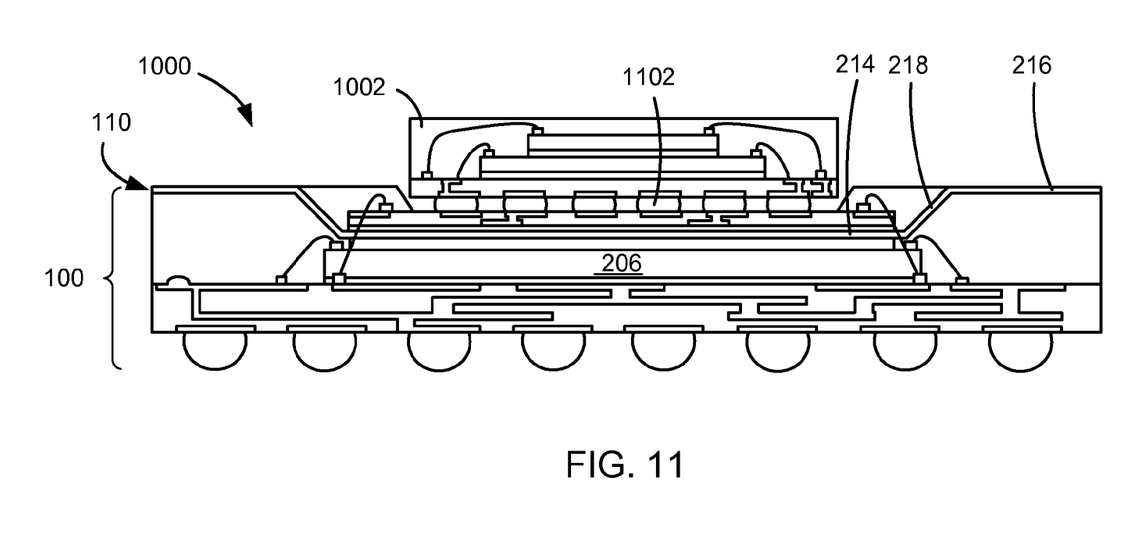
FIG. 11 is a cross-sectional view of the integrated circuit packaging system along line 11-11 of FIG. 10.

Referring now to FIG. 11, therein is shown a cross-sectional view of the integrated circuit packaging system 1000 along line 11-11 of FIG. 10. The stacking device 1002 can mount to the integrated circuit packaging system 100 with stacking interconnects 1102 mechanically and electrically connecting the stacking device 1002 and the integrated circuit packaging system 100.

The stacking interconnects 1102 are electrical connector structures to mechanically and electrically connect multiple devices with each other. Examples of the stacking interconnects 1102 are solder balls, solder bumps, conductive balls or bumps, or conductive posts or pillars.

The embeddable conductive structure 110 can shield the integrated circuit device 206 and the stacking device 1002 from EMI from each other when the embeddable conductive structure 110 is grounded. The embeddable conductive structure 110 can spread the heat generated by the integrated circuit device 206, the stacking device 1002, or a combination away from each other through the lower portion and the non-horizontal portion 218 to the elevated portion 216, which is away from the integrated circuit device 206 and the stacking device 1002.

It has been discovered that the present invention provides the integrated circuit packaging system 1000 provides improved thermal management in a PoP configuration. The lower portion 214 of the embeddable conductive structure 110 provides a separation between the integrated circuit device 206 and the stacking device 1002. This separation allows the lower portion 214 to conduct heat away from the integrated circuit device 206 and the stacking device 1002 to the elevated portion 216 to dissipate the heat to ambient thereby improving thermal management for the integrated circuit packaging system 1000.

It has also been discovered that the present invention provides the integrated circuit packaging system 1000 provides improved EMI performance in a PoP configuration. The lower portion 214 or some other portion of the embeddable conductive structure 110 can be grounded. Also, the lower portion 214 of the embeddable conductive structure 110 provides a separation between the integrated circuit device 206 and the stacking device 1002. This separation allows the lower portion 214 along with the other portions of the embeddable conductive structure 110 to divert EMI away from the integrated circuit device 206 and the stacking device 1002 to a ground connection thereby improving EMI performance.

Figure 12:
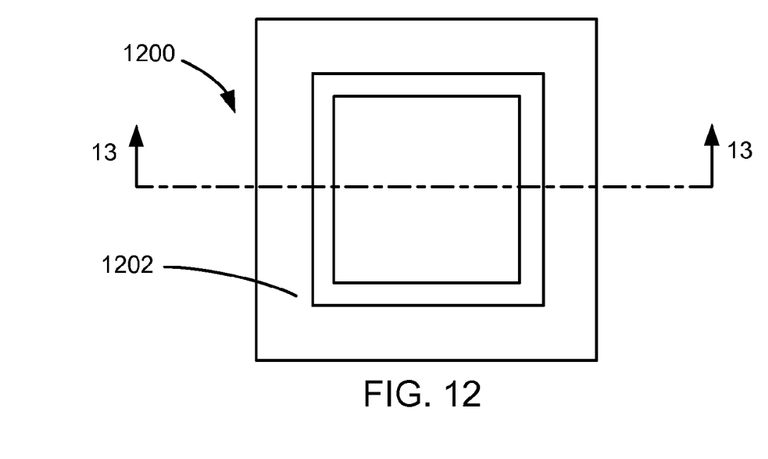
FIG. 12 is a top view of an integrated circuit packaging system in a third embodiment of the present invention.

Referring now to FIG. 12, therein is shown a top view of an integrated circuit packaging system 1200 in a third embodiment of the present invention. The integrated circuit packaging system 1200 can include a mountable conductive structure 1202. The mountable conductive structure 1202 is a thermally and electrically conductive element that can function as both as a heat spreader and an electromagnetic interference shied, if grounded.

Figure 13:
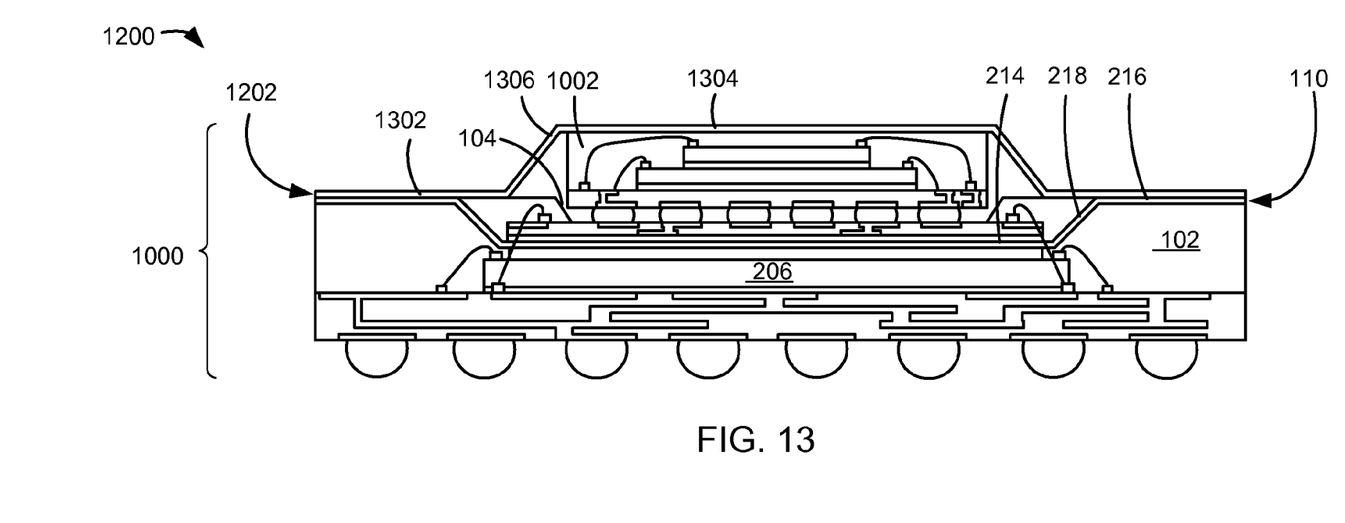
FIG. 13 is a cross-sectional view of the integrated circuit packaging system along line 13-13 of FIG. 12.

Referring now to FIG. 13, therein is shown a cross-sectional view of the integrated circuit packaging system 1200 along line 13-13 of FIG. 12. As an example, the mountable conductive structure 1202 can mount onto the integrated circuit packaging system 1000. The mountable conductive structure 1202 can include a peripheral portion 1302 and a top portion 1304 joined directly by a sloped portion 1306. The sloped portion 1306 and the top portion 1304 appear to be protrusion from the peripheral portion 1302.

The mountable conductive structure 1202 can be attached to the integrated circuit packaging system 1000 with the top portion 1304 over the stacking device 1002 and the recess 104. As a specific example, the top portion 1304 can be on the stacking device 1002.

The peripheral portion 1302 can be on the elevated portion 216 of the embeddable conductive structure 110, the encapsulation 102, or a combination thereof. The contact of the peripheral portion 1302 with the elevated portion 216 can enable the mountable conductive structure 1202 to function as a heat spreader or an EMI shield with the embeddable conductive structure 110 is grounded.

It has been discovered that the present invention provides the integrated circuit packaging system 1200 provides improved thermal management in a PoP configuration. Initially, the lower portion 214 of the embeddable conductive structure 110 provides a separation between the integrated circuit device 206 and the stacking device 1002. This separation allows the lower portion 214 to conduct heat away from the integrated circuit device 206 and the stacking device 1002 through the non-horizontal portion 218 to the elevated portion 216 to dissipate the heat to ambient thereby improving thermal management for the integrated circuit packaging system 1000. Moreover, the direct contact between the peripheral portion 1302 and the elevated portion 216 allows heat to be transferred from the elevated portion 216 to the mountable conductive structure 1202 providing more surface area exposed to the environment compared to the elevated portion 216 alone to dissipate heat thereby improving thermal management.

It has also been discovered that the present invention provides the integrated circuit packaging system 1200 provides improved EMI performance in a PoP configuration. Initially, the lower portion 214 or some other portion of the embeddable conductive structure 110 can be grounded. Also, the lower portion 214 of the embeddable conductive structure 110 provides a separation between the integrated circuit device 206 and the stacking device 1002. This separation allows the lower portion 214 along with the other portions of the embeddable conductive structure 110 to divert EMI away from the integrated circuit device 206 and the stacking device 1002 to a ground connection thereby improving EMI performance. Moreover, the mountable conductive structure 1202 covers the entire top side of the integrated circuit packaging system 1200 providing EMI protection to both the stacking device 1002 and the integrated circuit device 206 from EMI from the external environment thereby improving the EMI performance.

Figure 14:
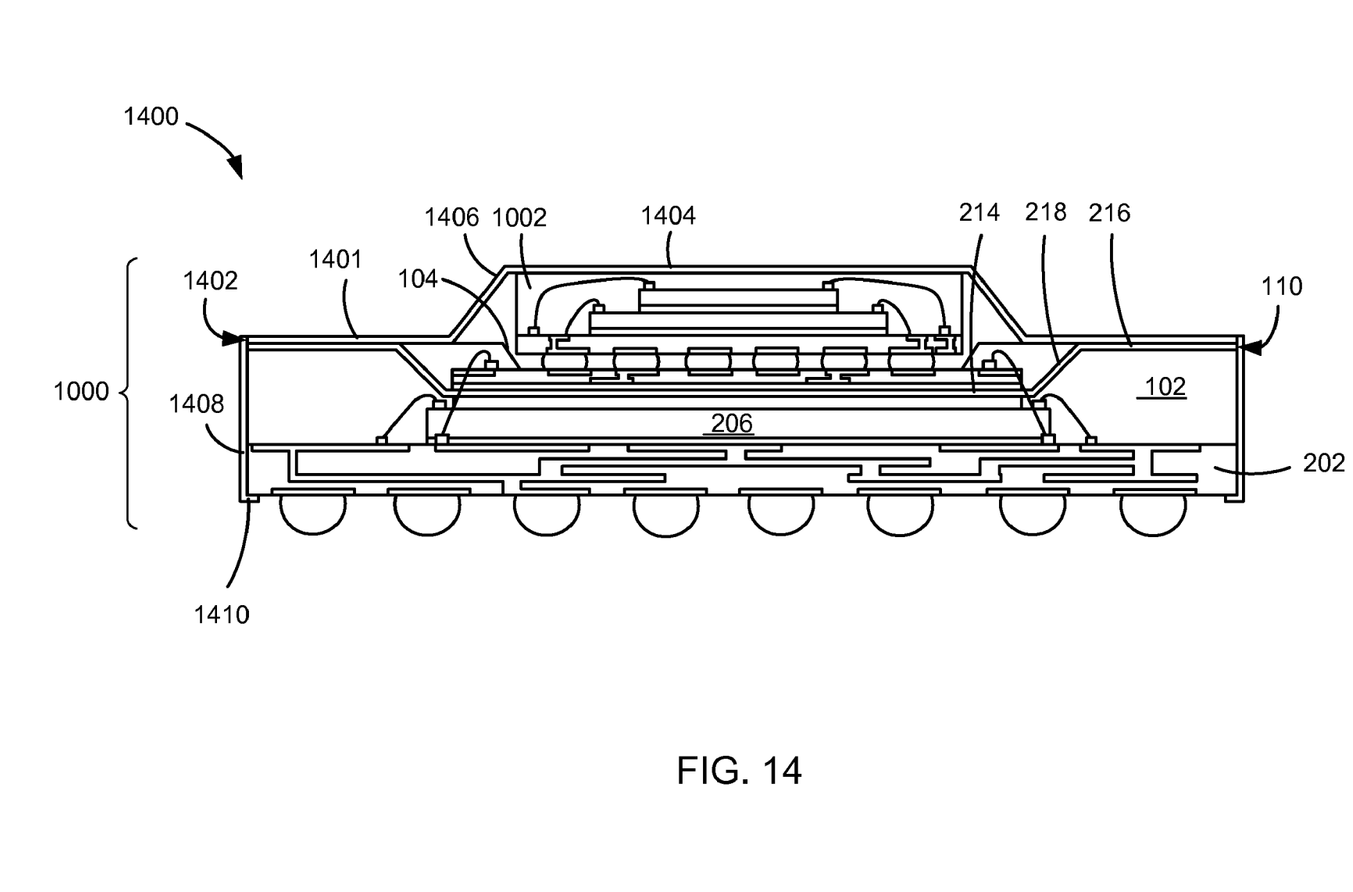
FIG. 14 is a cross-sectional view of an integrated circuit packaging system as exemplified by the top view of FIG. 12 along line 13-13 of FIG. 12 in a fourth embodiment of the present invention.

Referring now to FIG. 14, therein is shown a cross-sectional view of an integrated circuit packaging system 1400 as exemplified by the top view of FIG. 12 along line 13-13 of FIG. 12 in a fourth embodiment of the present invention. As an example, a mountable conductive structure 1402 can be similar to the mountable conductive structure 1202 of FIG. 13.

The mountable conductive structure 1402 can mount onto the integrated circuit packaging system 1000. The mountable conductive structure 1402 can include a peripheral portion 1401 and a top portion 1404 joined directly by a sloped portion 1406. The sloped portion 1406 and the top portion 1404 appear to be protrusion from the peripheral portion 1401. The mountable conductive structure 1402 can also include a side portion 1408 and a bottom portion 1410.

The mountable conductive structure 1402 can be attached to the integrated circuit packaging system 1000 with the top portion 1404 over the stacking device 1002 and the recess 104. As a specific example, the top portion 1404 can be on the stacking device 1002.

The peripheral portion 1401 can be on the elevated portion 216 of the embeddable conductive structure 110, the encapsulation 102, or a combination thereof. The contact of the peripheral portion 1401 with the elevated portion 216 can enable the mountable conductive structure 1402 to function as a heat spreader or an EMI shield with the embeddable conductive structure 110 is grounded.

The side portion 1408 can extend from the peripheral portion 1401 along the side of the integrated circuit packaging system 1400 having both the encapsulation 102 and the package carrier 202. The bottom portion 1410 can extend from the side portion 1408 and can be extended to below the package carrier 202.

It has been discovered that the present invention provides the integrated circuit packaging system 1400 provides improved thermal management in a PoP configuration. Initially, the lower portion 214 of the embeddable conductive structure 110 provides a separation between the integrated circuit device 206 and the stacking device 1002. This separation allows the lower portion 214 to conduct heat away from the integrated circuit device 206 and the stacking device 1002 through the non-horizontal portion 218 to the elevated portion 216 to dissipate the heat to ambient thereby improving thermal management for the integrated circuit packaging system 1000. Moreover, the direct contact between the peripheral portion 1401 and the elevated portion 216 allows heat to be transferred from the elevated portion 216 to the mountable conductive structure 1402 providing more surface area exposed to the environment compared to the elevated portion 216 alone to dissipate heat for the integrated circuit packaging system 1400. Further, the side portion and the bottom portion 1410 provides even more surface area for the integrated circuit packaging system 1400 to dissipate heat thereby improving thermal management.

It has also been discovered that the present invention provides the integrated circuit packaging system 1400 provides improved EMI performance in a PoP configuration. Initially, the lower portion 214 or some other portion of the embeddable conductive structure 110 can be grounded. Also, the lower portion 214 of the embeddable conductive structure 110 provides a separation between the integrated circuit device 206 and the stacking device 1002. This separation allows the lower portion 214 along with the other portions of the embeddable conductive structure 110 to divert EMI away from the integrated circuit device 206 and the stacking device 1002 to a ground connection thereby improving EMI performance. Moreover, the mountable conductive structure 1402 covers the entire top side of the integrated circuit packaging system 1400 providing EMI protection to both the stacking device 1002 and the integrated circuit device 206 from EMI from the external environment. Further, the side portion 1408 and the bottom portion 1410 provides additional EMI protection from the side of the integrated circuit packaging system 1400 thereby improving the EMI performance.

Figure 15:
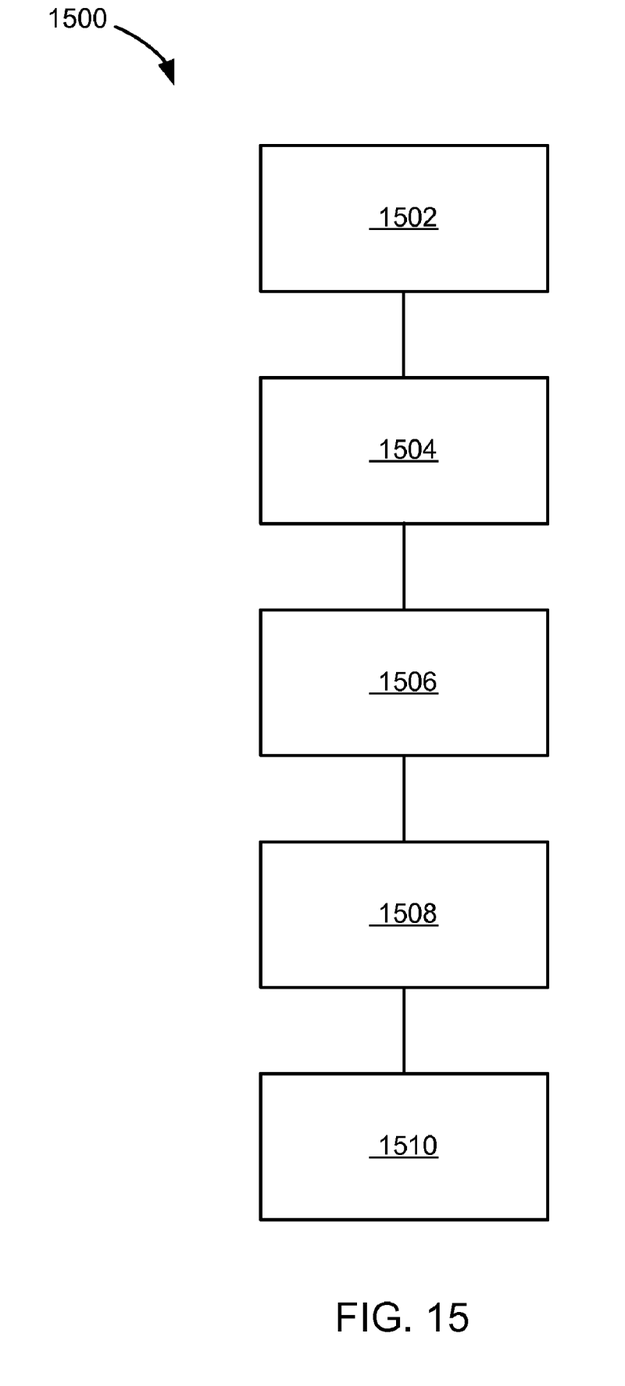
FIG. 15 is a flow chart of a method of manufacture of the integrated circuit packaging system in a further embodiment of the present invention.

Referring now to FIG. 15, therein is shown a flow chart of a method 1500 of manufacture of the integrated circuit packaging system 100 in a further embodiment of the present invention. The method 1500 includes: providing a package carrier in a block 1502; mounting an integrated circuit device to the package carrier in a block 1504; mounting an embeddable conductive structure, having a non-horizontal portion between a lower portion and an elevated portion and a hole, to the integrated circuit device with the lower portion over the integrated circuit device in a block 1506; mounting an interposer to the lower portion and below the elevated portion in a block 1508; and forming an encapsulation having a recess exposing the interposer and the elevated portion in a block 1510.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a package carrier;
   mounting an integrated circuit device to the package carrier;
   mounting an embeddable conductive structure, having a non-horizontal portion between a lower portion and an elevated portion and a hole, to the integrated circuit device with the lower portion over the integrated circuit device;
   mounting an interposer to the lower portion and below the elevated portion; and
   forming an encapsulation having a recess exposing the interposer and the elevated portion.

2. The method as claimed in claim 1 further comprising connecting an internal interconnect, through the hole, between the interposer and the package carrier.

3. The method as claimed in claim 1 further comprising:
   mounting a stacking device to the interposer and in the recess; and
   attaching a mountable conductive structure over the stacking device and on the elevated portion.

4. The method as claimed in claim 1 wherein:
   forming the encapsulation includes forming the encapsulation over the package carrier; and
   further comprising:
   mounting a stacking device to the interposer and in the recess; and
   attaching a mountable conductive structure over the stacking device and on the elevated portion, on the encapsulation, and on the package carrier.

5. The method as claimed in claim 1 wherein mounting the embeddable conductive structure includes mounting a strip of the embeddable conductive structure.

6. A method of manufacture of an integrated circuit packaging system comprising:
- providing a package carrier;
- mounting an integrated circuit device to the package carrier;
- mounting an embeddable conductive structure, having a non-horizontal portion between a lower portion and an elevated portion and a hole, to the integrated circuit device with the lower portion over the integrated circuit device;
- mounting an interposer to the lower portion and below the elevated portion; and
- forming an encapsulation having a recess exposing the interposer and the elevated portion and covering the non-horizontal portion and the lower portion.

7. The method as claimed in claim 6 wherein:
forming the encapsulation includes forming the encapsulation over the package carrier; and
further comprising:
- mounting a stacking device to the interposer and in the recess; and
- attaching a mountable conductive structure, having a side portion and a bottom portion, over the stacking device and on the elevated portion with the side portion on the encapsulation and on the package carrier with the bottom portion under the package carrier.

8. The method as claimed in claim 6 further comprising providing the embeddable conductive structure with the hole spanning from the lower portion to the elevated portion and across the non-horizontal portion.

9. The method as claimed in claim 6 wherein forming the encapsulation includes forming the encapsulation through the hole.

10. The method as claimed in claim 6 wherein:
forming the encapsulation includes forming the encapsulation over the package carrier; and
further comprising:
- mounting a stacking device to the interposer and in the recess; and
- attaching a mountable conductive structure, having a side portion, over the stacking device and on the elevated portion with the side portion on the encapsulation, on the package carrier, and on the elevated portion.

11. An integrated circuit packaging system comprising:
- a package carrier;
- an integrated circuit device mounted to the package carrier;
- an embeddable conductive structure, having a non-horizontal portion between a lower portion and an elevated portion and a hole, mounted to the integrated circuit device with the lower portion over the integrated circuit device;
- an interposer mounted to the lower portion and below the elevated portion; and
- an encapsulation having a recess exposing the interposer and the elevated portion.

12. The system as claimed in claim 11 further comprising an internal interconnect, through the hole, between the interposer and the package carrier.

13. The system as claimed in claim 11 further comprising:
- a stacking device mounted to the interposer and in the recess; and
- a mountable conductive structure over the stacking device and on the elevated portion.

14. The system as claimed in claim 11 wherein:
the encapsulation is over the package carrier; and
further comprising:
- a stacking device mounted to the interposer and in the recess; and
- a mountable conductive structure over the stacking device and on the elevated portion, on the encapsulation, and on the package carrier.

15. The system as claimed in claim 11 wherein the encapsulation partially covers the interposer.

16. The system as claimed in claim 11 wherein the encapsulation covers the non-horizontal portion and the lower portion.

17. The system as claimed in claim 16 wherein:
the encapsulation is over the package carrier; and
further comprising:
- a stacking device mounted to the interposer and in the recess; and
- a mountable conductive structure, having a side portion and a bottom portion, over the stacking device and on the elevated portion with the side portion on the encapsulation and on the package carrier with the bottom portion under the package carrier.

18. The system as claimed in claim 16 wherein the embeddable conductive structure has the hole spanning from the lower portion to the elevated portion and across the non-horizontal portion.

19. The system as claimed in claim 16 wherein the encapsulation is through the hole.

20. The system as claimed in claim 16 wherein:
the encapsulation is over the package carrier; and
further comprising:
- a stacking device mounted to the interposer and in the recess; and
- a mountable conductive structure, having a side portion, over the stacking device and on the elevated portion with the side portion on the encapsulation, on the package carrier, and on the elevated portion.

* * * * *